United States Patent
Labzentis et al.

(10) Patent No.: US 6,515,233 B1
(45) Date of Patent: Feb. 4, 2003

(54) METHOD OF PRODUCING FLEX CIRCUIT WITH SELECTIVELY PLATED GOLD

(76) Inventors: Daniel P. Labzentis, 628 McFadden Rd., Apalachin, NY (US) 13732; Francesco F. Marconi, R.D. #2, Box 2401, Hallstead, PA (US) 18822; Allan R. Knoll, 106 Smithfield Dr., Endicott, NY (US) 13760; David J. Bajkowski, R.R. #1, Box 1606, Hallstead, PA (US) 18822

(*) Notice: Subject to any disclaimer, the term of this patent is extended or adjusted under 35 U.S.C. 154(b) by 13 days.

(21) Appl. No.: 09/607,977

(22) Filed: Jun. 30, 2000

(51) Int. Cl.[7] .............................. H05K 1/00; H05K 1/10
(52) U.S. Cl. ...................... 174/254; 174/261; 174/255; 174/256; 361/749; 361/779; 29/846; 29/825; 29/839
(58) Field of Search .................... 174/250, 254, 174/261, 253, 260, 255, 256; 361/760, 749, 750, 774, 776, 779, 751, 777; 29/846, 825, 829

(56) References Cited

U.S. PATENT DOCUMENTS

| | | | | |
|---|---|---|---|---|
| 3,745,095 A | * | 7/1973 | Chadwick et al. | 205/126 |
| 3,781,596 A | * | 12/1973 | Galli et al. | 361/751 |
| 4,786,523 A | * | 11/1988 | Dohya | 427/96 |
| 4,925,522 A | * | 5/1990 | Avellino et al. | 216/20 |
| 4,963,701 A | * | 10/1990 | Yasumoto et al. | 174/256 |
| 5,176,811 A | * | 1/1993 | Keim et al. | 205/164 |
| 5,733,466 A | * | 3/1998 | Bendebo et al. | 216/13 |
| 5,830,533 A | * | 11/1998 | Lin et al. | 427/272 |
| 5,843,517 A | * | 12/1998 | Ferrier et al. | 427/98 |
| 5,864,470 A | * | 1/1999 | Shim et al. | 361/777 |
| 6,022,466 A | * | 2/2000 | Tamarkin et al. | 205/126 |
| 6,022,596 A | * | 2/2000 | Baum et al. | 427/555 |
| 6,048,465 A | * | 4/2000 | Shirai | 216/13 |
| 6,162,365 A | * | 12/2000 | Bhatt et al. | 216/13 |

\* cited by examiner

*Primary Examiner*—Albert W. Paladini
*Assistant Examiner*—J B Patel
(74) *Attorney, Agent, or Firm*—Salzman & Levy (57) ABSTRACT

Disclosed is a method of producing a flexible circuit board having gold selectively plated on only desired elements of the conductive circuits. These desired elements typically are attachment sites, such as wire bond pads or ball grid array pads, for semiconductor chips. This method eliminates the requirement to buss all circuits to a common plating contact by using a background seed metal for plating continuity. This method also provides a means to alleviate the requirement for precise registration or alignment when multiple photoresist layers are employed in order to selectively plate only a portion of the metallic elements present on the flexible circuit board. The defect of resist lifting followed by nickel/gold underplating is eliminated by conditioning the intermediate photoresist to survive the nickel/gold plating bath.

21 Claims, 6 Drawing Sheets

Prior Art

METHOD OF PRODUCING FLEX CIRCUIT WITH SELECTIVELY PLATED GOLD

FIELD OF THE INVENTION

A process of manufacturing microelectronic circuit packages without the use of commoning bars is provided, specifically the manufacture of flexible wiring boards having a nickel/gold wirebonding surface on wirebond and ball grid array pads is described.

DEFINITIONS AND ABBREVIATIONS

To facilitate the understanding of this specification and the appended claims, definitions to various words and phrases are provided;

Component—a functional unit that is attached to a printed wiring board package either through a surface mounting or through hole, Element—a functional unit integrally associated with the substrate of a printed wiring board (e.g., features and microcircuitry), Features—Elements other than microcircuitry that are an integral part of the substrate of a printed wiring board (e.g., planar resistors, pads, lands, and commoning bar), Lands—an SMT feature used for electrically interconnecting a component to a printed wiring board, Microcircuitry (or fine-line circuitry)- electrically conductive lines that carry I/O signals, power, or create a path to ground, Nascent—yet to be formed (e.g., in the process of manufacturing discrete microcircuitry, at early stages in the process the metallized microcircuits are formed but still are electrically attached to one another, at these stages the microcircuits are still in nascent form), SMT—surface mount technology, and VLSI—very large scale integrated circuit.

BACKGROUND OF THE INVENTION

In the past decade the density per unit area of electronic devices, such as VLSIs, has greatly increased. By some estimates this increase in density has been on the order of 10,000 times what it was in the earliest days of the technology. The space or area available outside of a VLSI in which to make the large number of necessary connections to and from it and to provide the necessary circuitry is becoming almost vanishingly small measured by previous standards.

Electronic circuits, and more particularly the more complex circuits found in computer logic systems, frequently employ one or more printed circuit or wiring boards on which various components or elements are mounted. Unlike the density increase of VLSIs, however, the density of passive circuits on printed wiring boards have increased by only a relatively small factor: less than about 4 to 1 as the components have not decreased in size significantly. This presents the difficult problem of providing circuitry on the printed wiring board which is small enough to fit the spaces available and which is also sufficiently reliable and manufacturable to be economically useful.

With this ever-continuing trend toward reduced size of electronic components and the resulting need for high density requirements in electronic packaging, there has been an increased demand to create a metallization process that will efficiently generate high quality, high density electronic packaging such as printed wiring board structures.

In order to electronically interconnect components and printed circuit boards for feeding electrical power and signals to the circuit elements and for extracting signals therefrom, various connector arrangements are utilized. Components of the external system can be integrated circuit chips, adapter cards, and insulating packages. The leads of these components are in the form of pads on the surface or other contacts extending therefrom in rows to form planar disposed arrays matched with conductive pads on circuits joined to circuit traces leading to and from the components.

Interconnection between the conductive pads or leads of a component to the conductive pads or traces of a circuit board is accomplished in a number of ways, including solder or, in instances where the removal and replacement of components is necessary during the life of a system, by some suitable electrical connector or disconnect. In the latter case, electrical connection between printed circuit boards and cards and external systems can be provided by gold contacts such as edge tabs, chip tabs, and lands. The gold contacts atop lands and tabs are typically provided by electrodeposition.

Electroplating is one method of depositing an adherent metal coating on a substrate for protection purposes. The substrate to be plated is connected to one terminal of d.c. or a pulsed plating voltage source and placed in an electrolyte. The metal to be deposited is connected to the other terminal and similarly immersed in the electrolyte. The transfer of the metal is accomplished via the ions contained in the current flowing between the electrodes.

Electroless plating is another method of depositing a metal. It involves the use of a plating bath without the imposition of any electric current. The substrate is plated by reduction of a plating metal from a solution of a salt of the plating metal. The plating solution contains controlled reducing agents which are generally catalyzed either by the surface of the substrate, or by some catalytic metal placed onto the surface both to initiate the reduction and to render good adherence. Since the plated-on surface is autocatalytic, an electroless process can be used to build up thicknesses.

Electrodeposition (electroplating) of gold has been the preferred method for plating gold, since the deposited gold has improved physical properties (e.g., less brittle) compared to electroless plated gold. This softness or plasticity is desirable in order to provide contact sites with high durability, especially where components can be replaced multiple times or wire bonding is required. The plasticity of electroplated gold also assists in ameliorating the brittleness of an electroless plated nickel or nickel/phosphorous layer that is optionally plated between the conductive copper features and the gold, or other precious metal overplating. However, a major disadvantage with electrolytic gold plating is the need for commoning bars to provide electrical connections to the features to be plated. These commoning bars require fairly large footprints on the printed wiring board, ultimately wasting valuable space that could otherwise be used for placement of additional circuitry or other features such as planar resistors, capacitors, inductors, diodes, or transistors.

As previously mentioned, numerous types and varieties of modern equipment and devices require sophisticated interconnection of electronic components. With the constant demand for reduced sizes in electronic components and the resulting high density of conductive interconnection surfaces on such equipment, there have been increased demands on the performance of contacts used to provide such interconnections.

A conventional pin and socket connector part, such as a 25 square metal wire-wrap post, has sufficient size and strength to permit it to be made and handled easily with conventional techniques. Typically parts of such "large" size are assembled into connector systems having "large" centers, such as one-tenth by one-tenth inch. But connectors this large and unwieldy are like the dinosaurs of a past age in the environment of the VLSIs of today. As interconnections are made smaller and smaller, the problems associated with manufacturing and assembling these miniature parts seem to grow exponentially.

Printed circuits are normally formed on boards or laminate sheets made of various epoxy compositions or fiberglass and relatively thin layers of copper which have been etched or deposited to define the desired circuit. The problem in each case is one of coupling interconnections from the relatively thin circuit conductor leads which are "printed" on the board to either a solder site or a mechanical connector which is generally three-dimensional. In the past, these boards or sheets were rigid substrates; but due to the desire to further reduce the size and weight of the passive circuitry and the added benefit of having the design of higher level packaging where planarity was no longer a restriction, the use of lightweight and flexible materials is advantageous. In turn, the trend toward flexible substrates requires the potential reoptimization of the interconnections and circuitry on the substrate due to changes in forces (i.e., bending forces) from directions not originally encountered in the rigid substrates. These bending forces have impact especially at interfaces between the components and the precious metal plated surface mounting on the substrate. Typically, the impact of these bending forces is detrimental to the adhesion between these components and their surface mountings.

Flexible film packages are generally similar to pre-preg based circuit packages but are thinner and are fabricated from polyimides, polyesters or the like rather than epoxy-glass fiber. Flex packaging is described by Donald P. Seraphim, Donald E. Barr, William T. Chen, George P. Schmitt, and Rao R. Tummala in *Printed Circuit Board Packaging*, at pages 853–921; on pages 870–872 of R. R. Tummala and E. J. Rymaszewski, *Microelectronics Packaging Handbook*, and also in *Flexible Circuit Technology* by Joseph Fjelstad (Silicon Valley Publishing Group) *and Flexible Printed Circuitry* by Thomas Stearns (McGraw-Hill Publishers, February 1996). These references are incorporated by reference to provide general background information on the processes and materials as known in the art as they correspond to the present invention.

The process of surface circuitization of flex packages, as described in the three references cited above, is typically begun by bonding copper foil with a suitable adhesive, such as epoxy or acrylic, and photolithographically patterning the copper into circuit leads. Subsequent processing of polymeric substrates includes circuitization; that is, the formation of a Cu signal pattern or power pattern on the prepreg or flexible support, or lamination of the prepreg to a power core.

Circuitization may be additive or subtractive. In the case of additive circuitization a thin adhesion layer, such as a thin film of chromium, is first applied to the flexible support. The adhesion layer may be applied by various techniques such as sputtering, evaporation, deposition, or wet seeding using palladium colloids. Typically, the film of adhesion metal is from about 50 Angstroms to about 500 Angstroms in thickness. Thicker layers of chromium result in internal stresses, while thinner layers may be non-continuous.

Thereafter a "seed" layer of copper is applied atop the adhesion layer. This copper seed layer is from about 1,500 Angstroms to about 50,000 Angstroms thick. It may be applied by sputtering, evaporation, electrodeposition, or electroless deposition.

Subsequently, photoresist is applied atop the copper seed layer, imaged, and developed to provide a pattern for circuit deposition. Copper circuitization is then plated onto the seed layer to provide the circuitization pattern on the surface of the package. The remaining photoresist is then stripped, leaving a thick copper plated circuitization pattern and a thin multilayer background of a seed copper-chromium adhesion layer.

The seed copper can be etched by various methods known in the art. The chromium adhesion layer is removed, for example, by etching with an etchant such as permanganate etches and/or chloride etches. However, these etchants require careful cleaning steps to removed permanganate or chloride entrapped within crevices. Permanganate and hydrochloric acid so entrapped and/or entrained can result in loss of adhesion long after fabrication. This is especially so in the case of subsequent application of gold thin films plated atop the copper circuitization.

Although the above described process is additive, subtractive processes can also be used to create metallized circuits. However, in order to achieve reduction in size of both circuitry lines and sites of interconnections for external components and yet have sufficient thicknesses for carrying current (i.e., high aspect ratios), the industry has preferentially utilized the known processes of additive and semiadditive feature construction.

These techniques, as opposed to subtractive construction, do not require etching of thick copper layers with the concomitant problems of waste and undercutting of the circuitry and features on the substrate surface. This latter detriment requires initial dimensions to be larger than specified for the final package and limits the distance between features. Therefore, the additive process and semi-additive process are preferred.

However, even using either a semiadditive or additive process, undesirable effects remain. In particular, by the very nature of the standard additive/semiadditive processes, selective gold plating of the features is usually a multi-step process that typically requires use of a first and second photoresist, wherein the first photoresist is used to define the electronic features. After this has been achieved, the first photoresist is removed and a second photoresist is utilized to provide at least a portion of the features with a precious metal overcoating. The placement of the second photoresist is crucial to obtain useful product; but, in fact, this alignment is very difficult to achieve. Even when alignment is achieved, the process of plating precious metals onto the exposed upper surface of the interconnections can be problematical. Seepage of the gold plating formulation down the sidewalls of the interconnections, between the sidewalls and the photoresist, can cause underplating of the remaining photoresist sections residing on the seed or thin foil layer and potential lifting of these resist sections from the substrate. When lifting occurs, there is potential to create unwanted plating between features causing them to be electrically shorted or near shorted.

An example of selective plating of two metals, one on top of the other, using two negative photoresists in a additive process, can be found in U.S. Pat. No. 4,866,008 issued to K. Brighton et al. entitled "Methods For Forming Self-aligned Conductive Pillars On Interconnects" (hereinafter referred to as '008). This patent teaches a process for metal plating on a semiconductor substrate employing a complex multistep process that consists of:

a) application of a uniform seed layer to the surface of the semiconductor substrate;

b) applying, imaging, and developing a negative working mask (photoresist) residing on the seed layer;

c) additively plating a conductive metal into first openings of the developed mask to create metal interconnects of a height that is less than the height of the first mask and the interconnect has a long and short side;

d) applying a second mask to cover the first mask and the metal interconnects, therefore the second mask is not planar;

e) imaging and developing the second mask to create second openings over portions of the metal interconnects, these openings having an essentially rectangular shape with a first dimension comparable to the length of the short side of the first opening and a second dimension that is slightly larger than the length of short side of the first opening, and these second openings define a pillar after additively plating a second metal;

f) the pillars described in (e) have essentially two pair of opposing sidewalls, one opposing pair consisting of the remaining unfilled first mask, while the second pair of opposing sidewalls consisting of the second mask;

g) plating the second metal to form the pillars on portion of the top surface of the interconnect base;

h) stripping the two masks and exposed seed layer; and i) applying a cladding layer on the exposed top and sidewall surfaces of the pillar and interconnect base.

The '008 patent differs from the present invention in a number of critical areas, examples include, the substrate in '008 is a semiconductive material, the first plating in '008 intentionally does not reach the height of the first mask, the second mask in '008 is not applied in a planar fashion, and the second mask in '008 creates openings that are over only a portion of any given underlying element (interconnect).

Another prior art method uses a permanent solder mask also as a gold mask. In this case the process is restricted to using electroless nickel/immersion gold processing, which produces an undesirable brittle interface at the nickel layer. The permanent solder mask also covers the outer edge of the component to be gold plated and therefore the gold if plating performed from this prior art process does not completely cover the topmost portion of the component.

A third prior art method involves stripping the first photoresist layer and re-applying a photoresist material for the purpose of separately defining the gold patterning. This method requires the use of a commoning bar or commoning layer to electrically connect the desired features that are to be plated. Several significant disadvantages are found when employing this method. They include; accurate alignment to the previously defined circuit pattern; penetration of the plating solution under the edges of the resist; and in the case where a seed layer is employed, removal or etch of the seed layer between the features to be plated (otherwise the areas between the features will also be plated thereby shorting the features). In this alternative prior art process flow, all conductive surfaces not to be plated must be cleared or masked prior to plating. Processes of this type also produce plating of the precious metal not only on the topmost surface of the feature but also unnecessarily on their sidewalls as well.

As already noted the electroplating of precious metals requires that all sites to be plated must be electrically connected to the plating bath. Typically, this requires a feature known as a commoning bar from which all other features must be electrically connected. These connections and commoning bar serve no useful function after processing. Between the commoning bar and these connections, much valuable "real estate" is made unavailable for product useful features (e.g., pin arrays and ball grid arrays). Additionally, plating then occurs not only on the desired features but also on the circuitry to the buss and the busses themselves. This additional plating area slows the plating process and wastes expensive raw materials which must then be reclaimed. Also, commoning bars often need to be disconnected from the product circuitry through additional etching and/or excising operations, thereby adding unnecessary production steps with the potential for yield loss and certain increase in manufacturing time and cost.

In electroplating, the resulting nickel/gold plating thicknesses are determined in part by the surface area being plated, dwell time in nickel/gold plating baths, and the current applied to the anodes. Therefore, in a conveyorized plating system, the thickness requirements of the product determine the speed at which the plating system can operate. By plating areas not required, the process has less latitude to either increase the thickness range achievable in the process, or increase the speed and throughput for a product at a given thickness specification.

To summarize the prior art status, nickel/gold plating to support wire bonding in BGA packages is applied to all of the circuitry (e.g., signal lines and ground/voltage planes) both front and back, after copper plating has been completed. However, nickel/gold plating is needed only on the upper surfaces of wire bond pads and BGA pads to facilitate wire bonding and ball reflow and therefore such processes are costly due to plating of valuable precious metals in areas where they are not required. Furthermore, the prior art processes suffer from a tendency to have resist lifting and consequent short/near short defects due to underplating which occurs in the nickel/gold plating operation. Considerable scrap results when this occurs with the concommitant loss of valuable raw materials.

SUMMARY OF THE INVENTION

Having described the current state of the art and associated problems that still remain, it is an object of the present invention to provide a printed wiring board that has high density microcircuitry and metallized features.

It is an object of the present invention to provide a method of forming a high density printed wiring board that may be single or double sided with metallized elements comprising circuitry, features, lands or pads and furthermore may be multilayered and have embedded circuitry.

It is another object of the present invention to provide a process and article therefrom that has minimal electrical shorting due to lifting of the photoresist during precious metal plating.

It is another object of the present invention to provide a simplified process for overplating at least a portion of the total number of metallized elements on a flexible support.

It is another object of the invention to selectively plate only the topmost surfaces of the metal lands or pads without wasteful plating in unwanted areas such as the sidewalls.

It is a further object of the present invention to provide a printed wiring board having precious metal overplated metallized lands that have high-quality bonding surface.

It is yet another object of the invention to exclusively overplate essentially the entire top surfaces of a portion of the lands on a flexible support, without significantly overplating the circuitry or features elements.

It is still another object of the present invention to provide a method of forming a printed wiring board having the beneficial properties derived from electrolytic plating noble metals without the need for a commoning bar.

The current invention encompasses a process for manufacturing microelectronic elements and microcircuitry lines for printing wiring boards having lands or pads for attachment of semiconductor chips. In particular, the process allows for selectively overplating the lands with at least one noble or precious metal. The overplating process in the current invention is performed without the need for conventional buss or commoning bars and the ancillary circuitry necessary between the lands and the bars in order to perform the overplating. In the current invention the plating circuitry is overplated with a precious metal by using an electrically conductive seed layer in combination with a unique series of steps involving at least two photoresist layers and employing an additive or semiadditive plating methodology. Using the seed layer and the photoresist layers in the manner described in detail below, it is possible to manufacture a flexible printed wiring board having certain lands non-conformally but essentially completely overplated on their topmost surfaces while having other elements such as circuit lines and other features essentially unplated.

BRIEF DESCRIPTION OF THE DRAWINGS

FIGS. 1a through 1j are cross sectional views showing the current invention process flow starting with a substrate and ending with a printed wiring board having metallized elements, a portion of which are overplated with precious metal;

FIGS. 1e' through 1j' are plan views corresponding to FIGS. 1e through 1j;

DESCRIPTION OF THE PREFERRED EMBODIMENT

A preferred embodiment of a manufacturing process of this invention will now be described with reference to FIGS. 1a through 1j and 1e' through 1j'. FIGS. 1a through 1j are cross-sectional views while FIGS. 1e' through 1j' are plan views corresponding to FIGS. 1e though 1j.

Figures 1A, 1E:
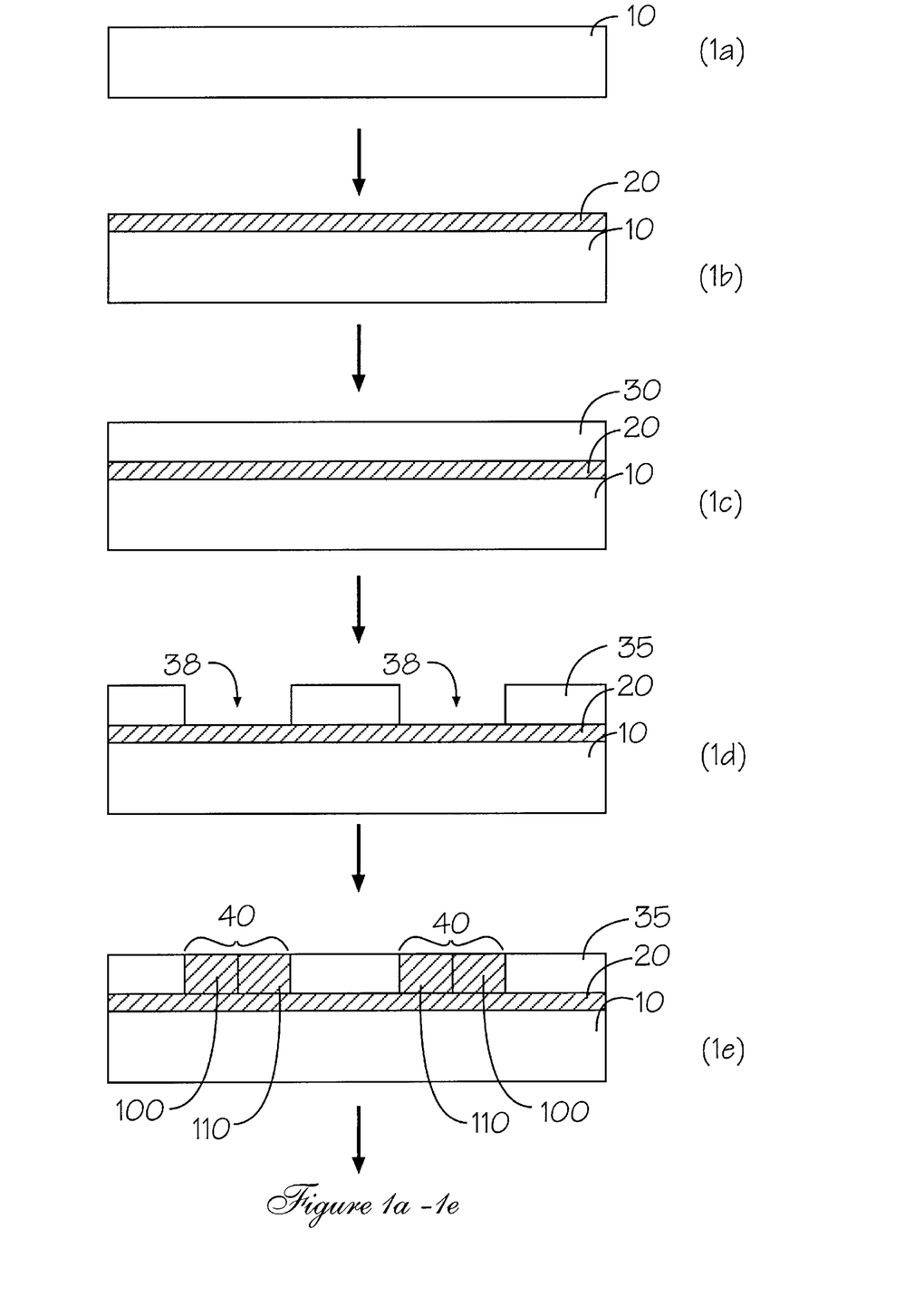

In FIGS. 1a and 1b, a substrate 10 is provided and conditioned on at least one lateral face to receive a seed layer 20. The seed layer 20 serves at least two important functions: first, it provides a surface on to which a conductive metal 40 (FIGS. 1e and 1e'), comprising features 100, fine-line circuitry 110 and pads or lands 120 (FIG. 1h'), can be plated; second, the seed layer 20 forms a cathodic connection to an electroplating bath to allow precious metal to be plated on lands 120. The seed layer 20, in FIG. 1b can further contain an essentially uniform metal layer (not shown). residing on the upper surface of the seed layer 20. This uniform metal layer is an optional feature of the present invention.

FIG. 1c depicts an essentially uniform layer of negative working photoresist 30 covering the optional uniform metal layer (not shown).

FIG. 1d depicts the photoresist 30 after imaging and developing to create openings 38 in the photoresist 30. The remaining portions of the photoresist 30 are further hardened to create toughened regions 35.

FIG. 1e depicts the electroplating of an electrically conductive metal into photoresist openings 38 (FIG. 1d), thereby creating nascent features 100 (FIG. 1f'), fine-line circuitry 110, and lands 120 (FIG. 1h') which will be electrically isolated in later steps of this inventive process.

Figure 1F:
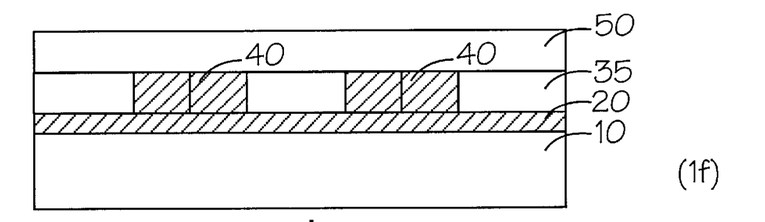

FIG. 1f depicts the placement of a second photoresist 50 applied in an essentially planar and uniform layer 50 over the nascent lands 120 and remaining first photoresist sections 35.

Figure 1G:
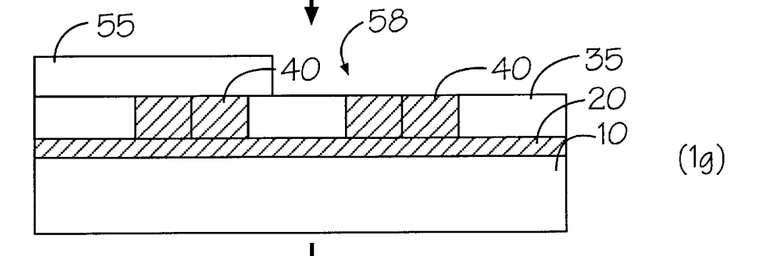

FIG. 1g depicts the imaging and developing of the second photoresist 50 to create openings 58 and remaining portions 55. It is to be noted that the openings 58 are designed to be larger than the lands 120 that are to be overplated later, while completely covering circuitry 110 and features 100 that are to remain unplated.

Figure 1H:
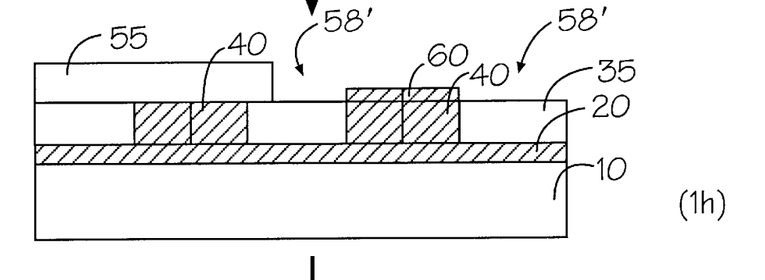

FIG. 1h depicts the precious metal overplating 60 of exposed lands 120. It should be noted that the overplating vertical thickness is a fraction of the thickness of the lands 120. Therefore, it is unnecessary to provide openings 58 that have the same cross-sectional dimensions as the cross-sectional dimensions of the lands 120 in order to retain the essential vertical nature of the sidewalls 45 of the lands 120. In other words, the overplated cross-sectional area having sidewalls 65 has essentially the same cross-sectional area as the previously unplated lands 120.

Figure 1I:
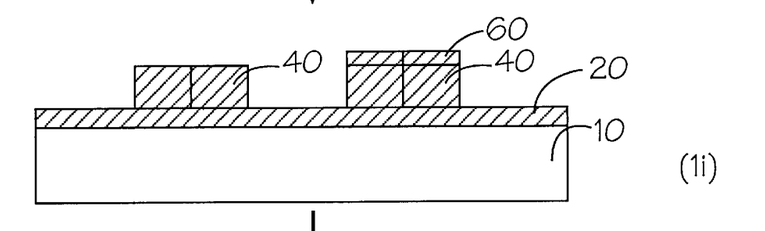

FIG. 1i depicts the stripping of both remaining first and second photoresist portions, 35 and 55 respectively.

Figure 1J:
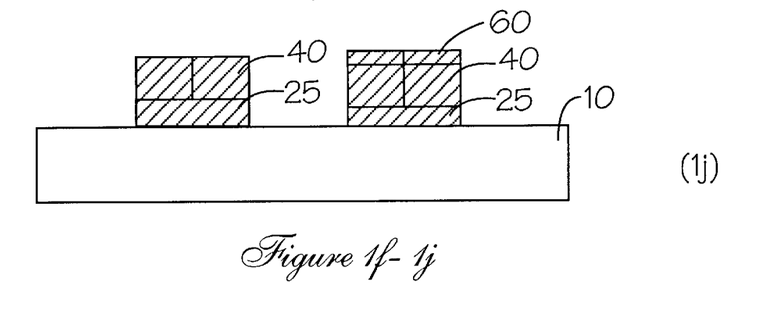

FIG. 1j depicts the etching of the uncovered optional uniform metal layer (not shown) and the seed layer 20 to leave sections 25 residing under all elements including features 100, circuitry 110, and lands 120 that are now electrically isolated from each other.

FIG. 1k depicts the etching of the uncovered optional uniform metal layer 80 and the seed layer 20 to leave sections 85 and 25 respectively, both residing under all elements including features 100, circuitry 110, and lands 120 that are now electrically isolated from each other.

Figure 2:
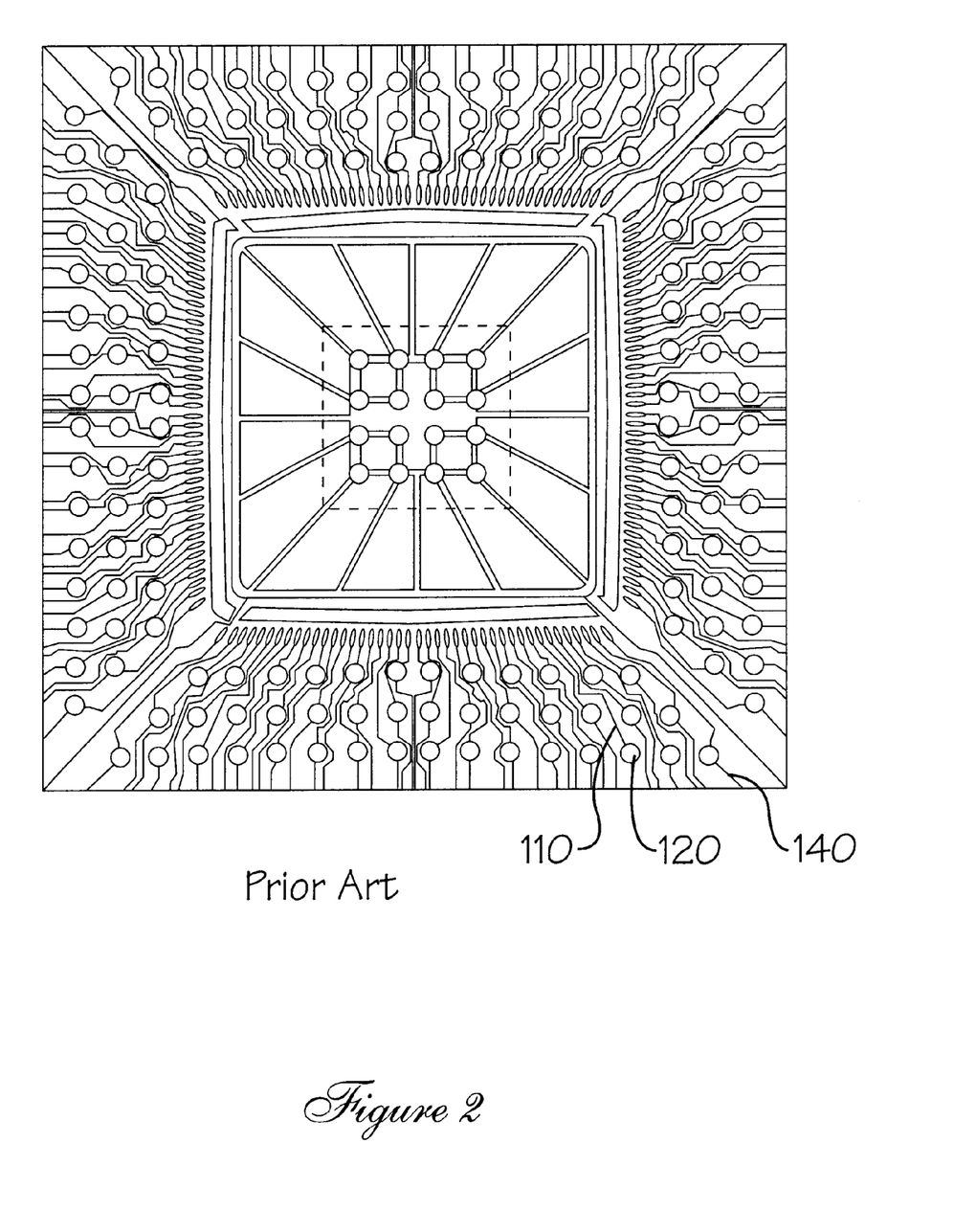
FIG. 2 is a plan view of a section of a prior art printed wiring board.

FIG. 2 depicts a section of a prior art printed wiring board having bus circuitry 140 attached to lands 120 and running to the end of the section where previously they would have been connected to a commoning bar.

Figure 3:
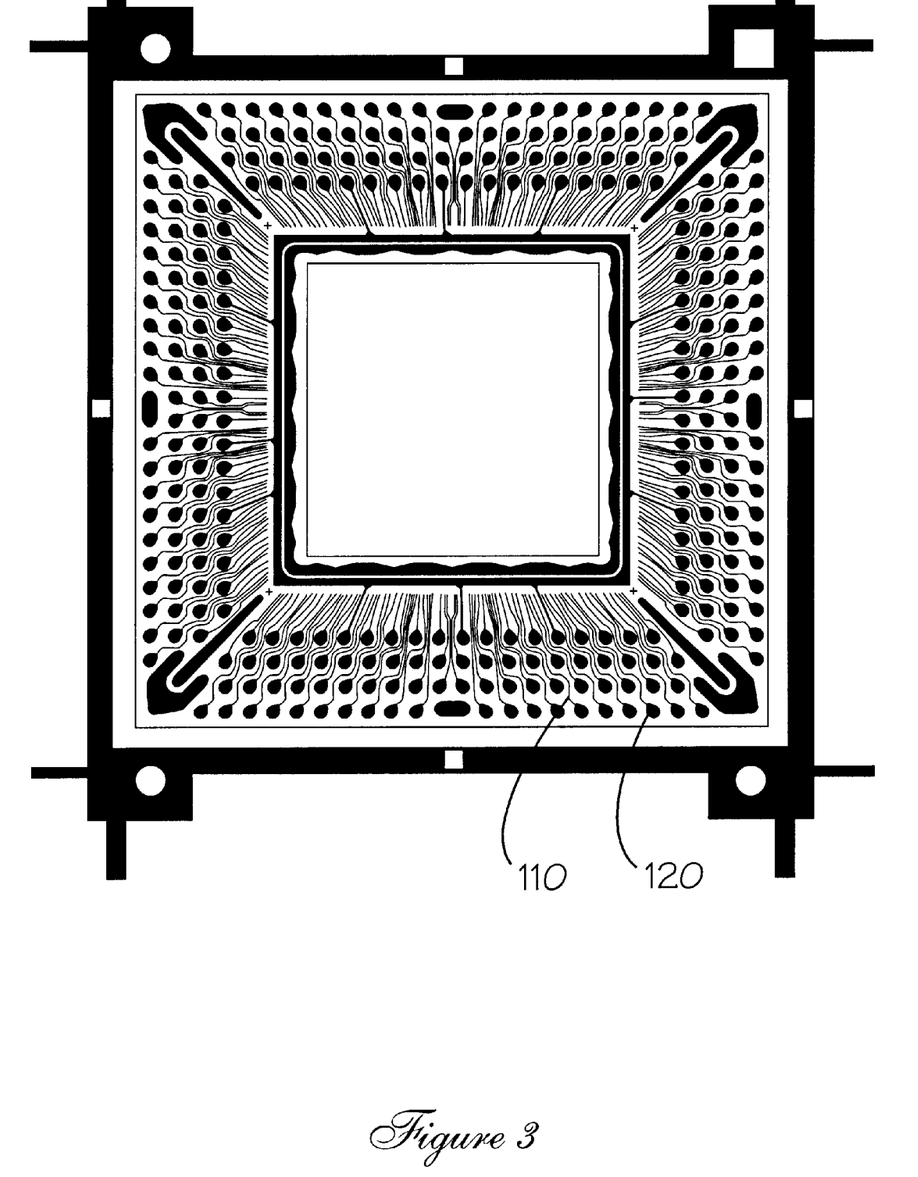
FIG. 3 is a plan view of a section of an inventive printed wiring board.

FIG. 3 depicts a section of an inventive printed wiring board, no bus circuitry 140 is attached to lands 120.

As mentioned supra, there are a number of problems associated with the prior art processes that are designed to precious metal overplate at least a portion of metallized elements affixed to a dielectric substrate. The more significant problems include:

a) when electroplating the pads or lands 120, electrical connections are required between the lands 120 and the plating bath. These electrical connections, such as bus or commoning bars, and the bus circuitry to connect them to the lands 120 serve no useful function to the final product. Furthermore, the connections take up valuable space on the wiring board;

b) by virtue of the unnecessary electric bus connections and bus bars described hereinabove, significantly more areas are electroplated than the desired lands 120. The effect of this unnecessary plating is that the plating process is slowed, the quality of the electroplate is poorer, and expensive raw materials must be reclaimed through additional process steps; and c) the prior art electroplating process causes a defect during the electroplating of the uppermost surface 48 of the lands 120. Typically, plating material will also seep into the interface area between the first photoresist remaining portions 35 and the sidewalls 45 of the lands 120. This seepage leads to electroplating on the sidewalls, but even more deleteriously, can further plate underneath the first resist remaining portions 35, ultimately causing electrical shorting or near shorting of features. This latter defect is known in the art as resist lifting and has been a long-standing problem.

The individual steps of the inventive process and the components of the physical embodiments will now be discussed in greater detail.

Substrate 10

The current invention utilizes a dielectric substrate 10 that is composed of a polymeric material such as polyimide, polyester, polyetherimide, polyetheretherketone, polysulfone, polyethersulfone, polyphenylene sulfide, polytetrafluoroethylene or the like, and epoxy based circuit board materials.

Preferred substrates have the ability to resist degradation when operated at elevated temperatures and also the ability to be readily deformed or bent into non-planar configurations. Therefore, most preferred substrate materials include polyimides and polyesters.

The thickness of the substrate in the present invention typically is greater than 0.5 mil. Preferred is between 1 mil and 5 mil. It is desirable that the substrate in the current invention be flexible; therefore, a most preferred thickness range is between 1 and 2 mil. The substrate may optionally contain punch or through holes or other vias, should that be desired.

Optional Adhesion Layer (Not Shown)

Typically, the dielectric substrate 10 does not provide adequate adhesion to metallized features 100 and circuitry 110 that are subsequently applied to the surface of the dielectric substrate. When this is the case, one of many known adhesion promoting processes is available as part of the present invention. Examples of some conventional processes include mechanical roughening of the surface, plasma treatment, chemical activation with metals or hexamethyldisilizane, and ozone or corona treatments. Preferably metals such as chromium, nickel, titanium, cobalt, and their oxides are applied to the major surfaces of the substrate to enhance adhesion.

Seed Layer 20

The dielectric substrate 10 does not provide a surface for which metallization can readily occur. To facilitate this process, a seed layer 20 is applied to the adhesion promoted, or untreated, dielectric substrate 10. The application and composition of seed layers is known in the art. Many application methods exist, including, lamination, vacuum evaporation, vacuum sputter deposition, catalytic seed and the carbon black process.

In one embodiment of the invention, the seed layer is uniformly applied to the entire substrate surface while in a second embodiment the seed layer is selectively applied as by screen printing. In this latter embodiment it is required that application of the seed material be made to all sites where future elements are to be plated.

The preferred seed layer 20 is dependent on the chemical composition of both the dielectric substrate 10 and the later-formed metallized features and circuitry. When copper and its alloys are used as the metallized features or circuitry, then the preferred seed layer 20 comprises copper, chromium, nickel, titanium, or oxides therof. In the particular case of copper, a preferred method of application is lamination of a thin sheet of copper metal under pressure to a major lateral surface of substrate 10.

It is desirable to apply a seed layer having a thickness between about 0.1 micron to about 5.0 micron, preferably between 0.1 micron and 0.5 micron.

The process described to this point essentially is known in the art as an additive process, however, the present invention can also be performed using the known semiadditive process previously described. In this latter process a uniform metal layer 80, typically of the same composition as the later applied metallization layer, is applied to the upper surface of the seed layer 20.

After formation of the seed layer 20 on the substrate the seed layer is optionally precleaned prior to applying a first photoresist layer 30 using such acids as phosphoric or oxalic acid at cold or room temperature.

The seed layer 20 plays a unique role in the present process of this invention. As differentiated from prior art processes the seed layer in the present invention is designed to act as the cathodic electrical connection to perform electroplating of the metal features and precious metal overcoating of these features. This can be achieved by not removing it prior to precious metal deposition and having it remain buried beneath the first and second photoresist layers.

First Photoresist Layer 30

The seed layer 20 is overcoated with an essentially uniform layer of a first photoresist or, more generally, a mask 30. In the present invention this photoresist 30 must be negative working. Many such negative-working photoresists are known in the industry and both dry film such as RISTON® (sold by dupont) and liquid aqueous processable photoresists such as AQUA MER CFI® (sold by Hercules Incorporated) have application in the present invention. In a preferred embodiment the first resist 30 comprises a dry film resist that is not tacky after application. This is especially important when the substrate 10 selected is a flexible material and during manufacture the coated substrate 10 will be rolled up. If the resist 30 is tacky it can cause the rolls to bind causing yield losses.

In the current invention the first photoresist 30 is applied by conventional means such as direct contact under pressure for a solid photoresist, or sprayed, spun on, or dipped for a liquid photoresist. In the present invention, a preferred method of application is laminating a dry film photoresist, for example at 3–5 Bar and 250° F. Typical thickness of the coated resist range from about 2 to about 76 micron, a preferred range being between about 15 to about 50 micron. Although thin coated photoresist layers 30 on the order of 2 to 5 micron are contemplated in this invention it is preferred when a flexible substrate 10 is employed the first photoresist 30 and subsequently formed metallic features 40 have a height about 15 to about 50 micron. In this latter case it is preferred that the photoresist 30 comprise a dry film or a viscous liquid photoresist. Most preferred for this latter embodiment are dry film photoresists.

Imaging and developing the first photoresist or mask produces holes or openings 38 and residual portions 35 thereby forming a circuit pattern. Imaging and developing of negative and positive photoresists are known in the art. These standard methods are well suited for the current invention. It is most important that the development process be complete (i.e., in areas to be removed by development, that all the photoresist is removed to uncover the underlying seed layer). Equally as important is that the sidewalls of the openings be as close to vertical as possible. Typical methods for imaging and developing include UV exposure through phototools, and subsequent developing in sodium carbonate or potassium carbonate.

In one preferred embodiment the holes that are created have an aspect ratio, defined by the ratio of the height of the photoresist layer to the cross-section of the opening 38 of approximately 1:1 This high aspect ratio allows for the creation of high density features 100 and circuitry lines 110 that are physically close to one another but of a sufficient height to be able to carry high current loads, such as required in power lines.

Optional steps in the inventive process allow the developed first photoresist portions 35 to be additionally hardened or cured by several alternative methods. These processes, known in the art as "bumping" include an IR bake or high dose actinic radiation exposure. Preferred from these alternatives is irradiating the first photoresist portions 35 with actinic radiation such as electron beam, x-ray, gamma ray, ultraviolet, and visible light. Most preferred is high dose near or far ultraviolet exposure. A useful dosage range of exposure is between 0.150 Joules/cm2 to 2 Joules/cm2. A preferred range is between 0.3 Joules/cm2 to 0.7 Joules/cm2. Depending on many factors, including the chemical nature of the photoresists and their thicknesses, these radiation doses may significantly vary from the ranges cited. However, the intent of the hardening process is to provide sufficient hardness to the portions of the first photoresist 35 so that during the later nickel/gold overplating process, seepage of the plating solutions at the interface of the sidewall 45 and the photoresist portion 35 is significantly reduced or eliminated. Although this hardening step, has in general been known in the art, specific aspects in the present invention require that an optimum level of bumping be provided. In the case of the present invention the hardened remaining first photoresist sections 35 reside on the seed layer 20 and overhardening the sections 35 will impact the adhesion to the seed layer 20, this is especially critical when the present invention utilizes a flexible substrate 10 wherein bending forces can create cracks in overhardened first photoresist sections 35 potentially causing seepage of later applied plating solution into the cracks thereby causing unwanted plating of the seed layer 20.

This optional bump step can be performed prior to or after the next described, metallization step.

Metallized Features 100, Circuitry 110, and Lands 120

Metallization of the seed layer 20 is known in the industry and can be performed either by an electroless or electrolytic plating process. Other processes that are also useful in the present invention can include such diverse methods as sputtering or lamination of a thin metal sheet (prior to first photoresist application). These additive processes differ from the known subtractive processes where uniformly thick metallized layers are etched to provide features 100, circuitry 110, and lands 120. However, another alternative embodiment of the current invention utilizes a process known as a semi-additive process. In this process a thin metallic layer (not shown) is applied to the seed layer 20 prior to applying the first photoresist layer 30. In this manner the thin metallized layer (not shown) as opposed to the seed layer 20 facilitates the metallization process.

A preferred method for additive metallization in the current invention comprises seeding and then electroplating or electrolessly plating from about 1 to about 75 micron, and preferably between 10 and 75 micron, depending on the height of the first photoresist 30. As required by this invention, the electoplating must essentially proceed until the electroplated metal height is essentially the same height as that of the first photoresist 30.

Any electrically conductive metal can be used in this metallization process as long as it can be applied in a uniform process and adhere to the seed layer 20. Typically, metals such as copper, aluminum, silver, gold, nickel, steel, and alloys thereof are utilized to torn the metallized regions 40. Preferably, these metals/alloys are copper, aluminum, and stainless steels containing greater than 4% chromium and optional quantities of molybdenum, nickel, and other metal elements.

It is preferred that the metallization or plating process uniformly and completely fill the openings 38 to create features 100, circuitry 110, and lands 120 that essentially have the same height as the vertical height of the developed first resist remaining portions 35. The inventive process employs a contact method using a profilometer and stylus from Dektak to determine copper vertical height of the metallized layer so the application of copper metal can be halted at a preferred height. Likewise, the later-applied nickel and gold layer thicknesses are measured by XRF (X-ray fluorescence). Total thicknesses are measured using optical measurements from a laser interferometer.

Second Photoresist Layer 50

After metallization to form the nascent metal features is completed, the intermediate now has an upper surface that is essentially planar and is composed of the upper surfaces of the features 100, circuitry 110, and lands 120 and first photoresist portions 35. To this composite topmost surface a second photoresist 50 is applied in essentially a planar fashion using various known techniques including preferably hot roll application or vacuum lamination.

The second photoresist may be chemically the same composition as the first photoresist. Either a positive or negative second photoresist can be utilized in the inventive process but it is preferable that the second photoresist be negative-working. In the case of the negative working photoresists, preferred materials and processes for applying, imaging, and developing can be found in the section dealing with the first photoresist.

The second photoresist will be used in a later step involving the selective plating of noble or precious metals onto the previously formed lands 120. Although these overplatings will be relatively thin compared to the heights of the lands 120, it is preferred that the height of the second photoresist layer after development be higher than the thickness of the overplating itself in order to provide structural integrity to the remaining second photoresist portions 55.

The inventive process requires that the holes 58 that are generated after developing the second photoresist 50 uncover the lands 120 while completely covering or masking the features 100 and circuitry 110 that are predetermined not to be overplated. Most important is that the holes 58 be larger than the individual lands 120 that have been predetermined to be overplated. In doing so, the need to have precise alignment of the openings 58 with the predetermined lands 120 is no longer a critical factor. Furthermore, the entire top surfaces of the lands 120 are desired to be overplated in this process whereas some prior art processes are designed to only create an electrical interconnect between a portion of the cross-sectional area of one metal element with another. Additionally, when prior art processes employ solder masks it is not possible to overplate the entire top surface os the lands 120 since a certain portion of the lands are covered by the mask.

Furthermore, prior art processes had to take especial care to align these lands 120 in order to completely plate the upper surface 48 of the lands 120. This inventive approach can be employed because, unlike other prior art processes, where a second photoresist is typically used to metallize a second layer on top of the first metallized layer, in the inventive process only a thin overplating is being performed. The prior art process typically had a second metallized layer comparable in thickness to the first metallized layer and therefore the openings of the second photoresist had to be not only precisely placed over the features but also of approximately the same cross-section otherwise the second metallization would grow in a non-vertical manner relative to the lower portion, increasing the cross-sectional area and thereby limiting the pitch between the features 100.

As with the first photoresist, the second photoresist portions 55 can likewise be subjected to additional hardening using independently the alternatives presented for the first photoresist portions 35. In a preferred embodiment of the invention both portions 35 and 55 are hardened in a bump process. In this case hardening can be performed either sequentially or in an overlapping time period. In a second preferred embodiment both portions 35 and 55 are simultaneously treated.

Overplating

In the inventive process the plating over the predetermined lands 120 typically comprises a noble or precious metal such as gold, platinum or palladium. The application of the precious metal can be performed in a variety of ways including such diverse methods as spraying by arc, flame, or plasma; sputtering or deposition by chemical vapor deposition or vacuum deposition; cladding; or plating by electrolytic or electroless means. As discussed supra, the properties associated with electrolytically plated precious metals, in particular gold, are superior to electrolessly plated precious metals. However, in order to electrically plate precious metals onto individual lands 120, these elements must be electrically connected to the plating bath. Prior art techniques achieve this by utilizing a commoning bar and then having bus circuitry connecting each land 120 to the commoning bar. These additional busses and bus circuitry create complexity and utilize valuable wiring board surface area. After the plating process these bus circuits are of no use and the bus area is physically removed. Additionally, the bus circuits and commoning bars are themselves plated thereby wasting expensive raw materials. The precious metals are then typically recovered from the commoning bar by performing additional processing steps.

The inventive process eliminates the need for using the commoning bars by electrically connecting all the lands 120 through the original seed layer.

Since the inventive process plates significantly less area than the prior art method, the process of electroplating proceeds at a more rapid rate. An unexpected result is that the quality of the overplating is superior to those found from either using a second photoresist opening 58 that is of the same cross-section as the land 120 to be overplated, and also superior to the overplating produced from the commoning bar approach.

It is an optional embodiment of the current invention to provide an intermediary layer between the conductive lands 120 to be overplated with precious metals. As is known in the art, there can be some benefits derived from applying this intermediary layer which is typically comprised of nickel, phosphorous, palladium or alloys thereof. These materials can be either electroless or electrolytically plated and as in the case with the noble metal layer discussed above substantially cover the upper surface of the lands 120. In a preferred embodiment of the invention nickel/phosphorous is electroplated onto the lands 120 prior to electroplating precious metal. The thickness of the plated nickel/phosphorous is typically between 0 micron and 5 micron. A preferable thickness range is between about 0.5 and 1.5 micron. In the present invention the thickness of the precious metal layer, either with or without the optional nickel or nickel/phosphorous layer is between 5 and 100 microinches (0.125 micron to 2.5 micron). The preferred precious metal layer thickness is between about 0.25 micron and 1.25 micron.

Photoresist Stripping

The photoresist portions 35 and 55 that have remained in place on the substrate 10 are now removed to completely uncover the plated and unplated lands 120. The stripping processes used in the present invention are commonly used in the industry except when either the first or second photoresist portions, 35 and 55 respectively, have been optionally hardened. In this case the stripping process involves exposing the substrate comprising first and second photoresist portions 35 and 55 respectively to a basic solution, typically 0.5 to 2.0% sodium hydroxide at a dwell time and temperature as required to completely remove essentially all traces of photoresist portions 35 and 55.

Seed Layer Stripping

In order to produce finished product, the nascent features 100, circuitry 110, lands 120 have to be electronically isolated from each other. Up to this point in the process these elements have been electrically attached through the seed layer 20. The seed layer, being a thin layer, can easily be etched using known methods, typically involving application of a solution of chemical etchants such as ferric chloride or sodium persulfate. The preferred method utilizes a two step process employing a copper etch to remove the uncovered seed layer 20 and a chrome etch to remove the uncovered adhesion layer. The chrome etch is typically performed using a solution of potassium permanganate.

Solder Mask Application

In an optional embodiment of the present invention, a solder mask can be applied to the stripped circuit board. The solder mask serves to protect areas of the finished circuit board that are not to receive solder at a later manufacturing stage. The solder mask typically is a plastic material that is selectively applied to the finished upper surface of the circuit board. Unlike the prior art, where the solder mask is sometimes used to also serve as a resist for the application of the noble metal; in the present invention the solder mask is applied only after the features are noble metal plated. The creates at least two notable differences between the prior art circuit boards and the inventive circuit boards. In the first case, since prior art masks are applied prior to noble metal plating, noble metal plating is restricted to areas only where there are openings in the mask (i.e., no noble metal plating will reside beneath the solder mask). Second, features to be noble metal plated, the mask must typically cover not only the surrounding area but also a portion of the topmost surface of the feature. In this manner, only a portion of the topmost surface can then be noble metal plated. These two differences can be readily used to distinguish the present invention embodiments from prior art embodiments.

Uses of Inventive Embodiments

The physical embodiments derived from this inventive process can be used in such applications in microelectronic packaging as printed wiring boards for attachment of VLSI and LSI semiconductor chips. Examples include tape ball grid array (TBA) chip carriers, wire bond ball grid array (BGA) carriers, and various other flex circuits requiring flip chip or wire bond attachment of an external device. Flip chip attachments, known in the art as controlled collapse chip connections (C4), and wire bond BGA are most preferred.

We claim:

1. A flexible printed wiring package having discrete metal elements comprising:
   a dielectric, flexible substrate;
   a plurality of electrically isolated and discrete metallic elements having a topmost surface and sidewall surfaces, said metallic elements affixed indirectly to said dielectric, flexible substrate by a seed layer therebetween; and
   a precious metal layer residing essentially exclusively on said topmost surface of a portion of said metallic elements, and essentially no precious metal residing on said sidewall surfaces.

2. The printed wiring package as recited in claim 1, wherein said precious metal layer covers essentially all of said topmost surface.

3. The printed wiring package as recited in claim 2, wherein said precious metal plated metallic elements comprise lands.

4. The printed wiring package as recited in claim 3, where said lands are ball grid array pads, flip chip attachment pads, or wire bond pads.

5. The printed wiring package as recited in claim 3, where said flip chip attachment pads comprise C4 pads.

6. The printed wiring package as recited in claim 2, having an absence of electrical bus circuitry lines extending from said metal features to an external electrical source for the purpose of electrically overplating said metal features.

7. The printed wiring package as recited in claim 2, wherein said metallic elements comprise copper, aluminum, nickel, gold and its alloys.

8. The printed wiring package as recited in claim 2, wherein said metallic elements comprise copper and its alloys.

9. The printed wiring package as recited in claim 2, wherein said precious metal comprises immersion, electroless or electrolytic gold.

10. The printed wiring package as recited in claim 2, wherein said precious metal comprises electrolytic gold.

11. The printed wiring package as recited in claim 1, further comprising a layer of nickel nickel/phosphorous or palladium between said conductive layer and said precious metal layer.

12. The printed wiring package as recited in claim 11, wherein said precious metal layer covers essentially all of said topmost surface of a portion of said plurality of electrically isolated and discrete metallic elements.

13. The printed wiring package as recited in claim 12, having an absence of electrical bus circuitry lines.

14. The printed wiring package as recited in claim 12, wherein said metallic elements comprise copper and its alloys.

15. The printed wiring package as recited in claim 14, wherein said precious metal comprises electroless or electrolytic gold.

16. The printed wiring package as recited in claim 15, wherein said dielectric substrate comprises a flexible film.

17. The printed wiring package as recited in claim 16, wherein said flexible film comprises polyimide.

18. A method of fabricating a flexible printed wiring package having discrete metal elements, said method comprising the steps of:
   a) selectively over-plating lands on an electrically conductive seed layer with at least one noble or precious metal, said over-plating being performed without requiring a conventional buss, commoning bars, or ancillary circuitry between said lands and said commoning bars; and
   b) using at least two photoresist layers with said electrically conductive seed layer to essentially completely over-plate said lands on a topmost surface thereof, while leaving other elements and other features and surfaces of said lands essentially non-plated.

19. The method of fabricating a flexible printed wiring package in accordance with claim 18, wherein said selectively over-plating step (a) employs additive or semi-additive plating methods.

20. The method of fabricating a flexible printed wiring package in accordance with claim 18, further comprising the step of:
   c) utilizing said electrically conductive seed layer and said at least two photoresist layers to provide non-conformal lands.

21. The method of fabricating a flexible printed wiring package in accordance with claim 18, further comprising the step of:
   c) removing a photoresist layer during said over-plating of said lands, step (a), with at least one noble or precious metal.

* * * * *